United States Patent
Huang

(10) Patent No.: US 9,859,883 B2
(45) Date of Patent: Jan. 2, 2018

(54) GATE DRIVER AND CONTROL METHOD THEREOF

(71) Applicant: uPI Semiconductor Corp., Hsinchu County (TW)

(72) Inventor: Hua-Chiang Huang, Hsinchu County (TW)

(73) Assignee: uPI Semiconductor Corp., Hsinchu County (TW)

( * ) Notice: Subject to any disclaimer, the term of this patent is extended or adjusted under 35 U.S.C. 154(b) by 314 days.

(21) Appl. No.: 14/269,204

(22) Filed: May 5, 2014

(65) Prior Publication Data
US 2015/0263620 A1    Sep. 17, 2015

(30) Foreign Application Priority Data

Mar. 13, 2014    (TW) .............................. 103109035 A

(51) Int. Cl.
| H03B 1/00 | (2006.01) |
| H03K 17/16 | (2006.01) |
| H03K 5/151 | (2006.01) |

(52) U.S. Cl.
CPC ......... *H03K 17/162* (2013.01); *H03K 5/1515* (2013.01); *H03K 2217/0081* (2013.01)

(58) Field of Classification Search
CPC ............. H01L 51/0072; H01L 51/0074; H01L 2924/00
See application file for complete search history.

(56) References Cited

U.S. PATENT DOCUMENTS

| 5,666,280 A | 9/1997 | Janaswamy et al. |
| 6,072,361 A | 6/2000 | Myers et al. |
| 6,172,493 B1 | 1/2001 | Grant |
| 7,514,908 B2 | 4/2009 | Hosokawa et al. |
| 7,538,583 B2 | 5/2009 | Bryson |
| 8,063,616 B2 | 11/2011 | Bahramian et al. |
| 8,154,334 B2 | 4/2012 | Wang |
| 8,310,284 B2 | 11/2012 | Heck |
| 8,598,916 B2 | 12/2013 | Miller et al. |
| 2006/0044051 A1 | 3/2006 | Locatelli |

(Continued)

FOREIGN PATENT DOCUMENTS

TW    201225527    6/2012

OTHER PUBLICATIONS

"Office Action of Taiwan Counterpart Application", dated Dec. 15, 2015, p. 1-p. 5, in which the listed references were cited.

*Primary Examiner* — Sibin Chen
(74) *Attorney, Agent, or Firm* — JCIPRNET

(57) ABSTRACT

A gate driver and a control method thereof are provided. The gate driver is coupled to a capacitor. The gate driver includes a timing control circuit and a switch unit. The switch unit is coupled to the timing control circuit, the capacitor and a working voltage. The timing control circuit receives an input control signal and performs a timing control to the input control signal to generate a first control signal and a second control signal. The switch unit includes a first switch element and a second switch element. The second switch element controls a body voltage of the first switch element according to the second control signal. The switch unit enables the working voltage to charge the capacitor via the switch unit according to the first control signal and the second control signal.

17 Claims, 7 Drawing Sheets

(56) References Cited

U.S. PATENT DOCUMENTS

| | | | |
|---|---|---|---|
| 2009/0219077 A1* | 9/2009 | Pietri | H02M 3/073 327/536 |
| 2011/0316500 A1 | 12/2011 | Tang et al. | |
| 2012/0256188 A1* | 10/2012 | McDonald | H01L 25/074 257/76 |
| 2014/0084805 A1* | 3/2014 | Kim | G09G 3/2048 315/228 |
| 2014/0098574 A1* | 4/2014 | Hara | H02M 3/33592 363/21.02 |

* cited by examiner

GATE DRIVER AND CONTROL METHOD THEREOF

CROSS-REFERENCE TO RELATED APPLICATION

This application claims the priority benefit of Taiwan application serial no. 103109035, filed on Mar. 13, 2014. The entirety of the above-mentioned patent application is hereby incorporated by reference herein and made a part of this specification.

BACKGROUND

Technical Field

The invention relates to a gate driving technique, and particularly relates to a gate driver and a control method thereof.

Related Art

FIG. 1 is a schematic diagram of a conventional gate driver. Referring to FIG. 1, in order to accurately control a voltage level across a capacitor C2 to be not greater than a withstand voltage value, the gate driver 100 detects the voltage value across the capacitor C2 by using a comparator 110, and transmits a detecting result to a level shift circuit 120. Once the detecting result indicates that the voltage value is over or lower than a threshold range of a voltage reference value REF, the level shift circuit 120 turns off a P-type metal oxide semiconductor transistor (PMOS) 130. However, during a process that the gate driver 100 controls switching of a first switch 140 and a second switch 150, the first switch 140 and the second switch 150 are all turned off in a transient time period. The transient time period is a non-interactive time period, which is about 2 nanoseconds (ns). During the non-interactive time period, an inductor current IL flows through a parasitic diode of the second switch 150, and now if a working voltage VDD continuously charges the capacitor C2 through a diode 132 and the PMOS 130, the voltage value across the capacitor C2 probably exceeds a withstand voltage range of the first switch 140. In other words, it is difficult to accomplish a series of procedures (such as detection, determination and control procedures) within such short non-interactive time period. For example, within 2 ns, the comparator 110 detects the voltage across the capacitor C2, and the level shift circuit 120 determines whether to turn off the PMOS 130 according to the detecting result. Therefore, an actual circuit design thereof is difficult, and the cost is increased due to a complicated circuit design.

SUMMARY

The invention is directed to a gate driver and a control method thereof to resolve the problem mentioned in the related art.

The invention provides a gate driver, which is coupled to a capacitor. The gate driver includes a timing control circuit and a switch unit. The timing control circuit receives an input control signal and performs a timing control to the input control signal to generate a first control signal and a second control signal. The switch unit is coupled to the timing control circuit, the capacitor and a working voltage, and enables the working voltage to charge the capacitor through the switch unit according to the first control signal and the second control signal. The switch unit includes a first switch element and a second switch element. The second switch element is coupled to the first switch element, and controls a body voltage of the first switch element according to the second control signal.

In an embodiment of the invention, the input control signal is a driving input signal. When the driving input signal is changed from a first level to a second level, the timing control circuit generates the first control signal and the second control signal after a predetermined time.

In an embodiment of the invention, the input control signal is a driving signal. When the driving signal is changed from a first level to a second level, the timing control circuit generates the first control signal and the second control signal after a predetermined time.

In an embodiment of the invention, the gate driver is coupled to a phase node, the input control signal is a phase control signal, and when a voltage on the phase node is changed from a negative voltage to a predetermined voltage, the phase control signal is generated to enable the timing control circuit to generate the first control signal and the second control signal after a predetermined time.

In an embodiment of the invention, when the input control signal is changed from a second level to a first level, the timing control circuit controls to turn off the switch unit so that the working voltage is unable to charge the capacitor through the switch unit.

In an embodiment of the invention, the gate driver is further coupled to a first switch and a second switch, the first switch is coupled to the second switch, the first switch and the second switch have a phase node there between, and the gate driver is coupled to the phase node.

In an embodiment of the invention, the input control signal is associated with the second switch.

In an embodiment of the invention, the first switch and the second switch is a gallium nitride transistor.

The invention provides a control method of a gate driver, which includes following steps. A timing control circuit and a switch unit are provided, wherein the switch unit is coupled to the timing control circuit, a capacitor and a working voltage, where the switch unit includes a first switch element and a second switch element. The timing control circuit is used to receive an input control signal and perform a timing control to the input control signal to generate a first control signal and a second control signal. The switch unit is used to enable the working voltage to charge the capacitor through the switch unit according to the first control signal and the second control signal, where the second switch element controls a body voltage of the first switch element according to the second control signal.

According to the above descriptions, the gate driver of the invention includes the timing control circuit and the switch unit. The timing control circuit performs timing control to the input control signal to generate the first control signal and the second control signal. The switch unit enables the working voltage to charge the capacitor through the switch unit according to the first control signal and the second control signal, where the switch unit includes a first switch element and a second switch element, and the second switch element controls the body voltage of the first switch element according to the second control signal. In this way, by controlling a charging path of the capacitor, damage of a switch in the output stage due to excessive voltage across the capacitor is avoided. On the other hand, compared to the conventional technique, the gate driver and the control method thereof provide a simple circuit design, and the gate driver can be configured to an integrated circuit to decrease a layout area and cost thereof.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
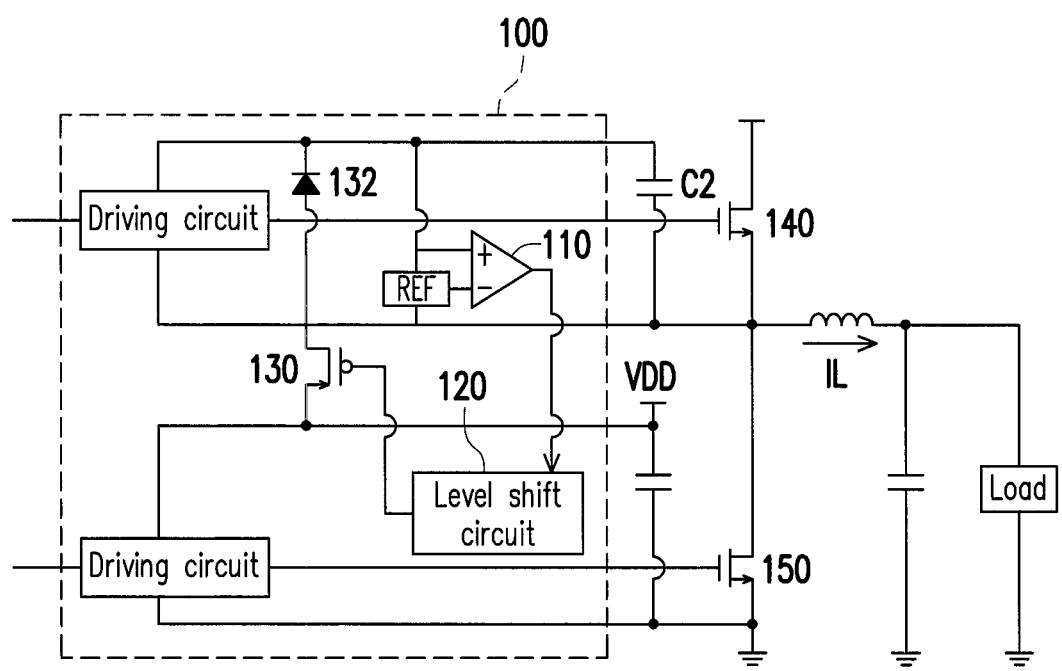
FIG. 1 is a schematic diagram of a conventional gate driver.

Reference will now be made in detail to the present preferred embodiments of the invention, examples of which are illustrated in the accompanying drawings. Wherever possible, the same reference numbers are used in the drawings and the description to refer to the same or like parts.

In the following embodiments, when a device is described to be "connected" or "coupled" to another device, it is interpreted as that the device is directly connected to or coupled to the other device, or the device is indirectly connected to or coupled to the other device through other devices or connection means. A term "circuit" or "unit" represents at least one device or a plurality of devices, or devices actively and/or passively coupled to each other to provide a suitable function. A term "signal" represents at least one current, voltage, load, temperature, data or other signal. It should be noticed that a physical property of the signals referred throughout the descriptions and figures can be voltage or current.

Figure 2:
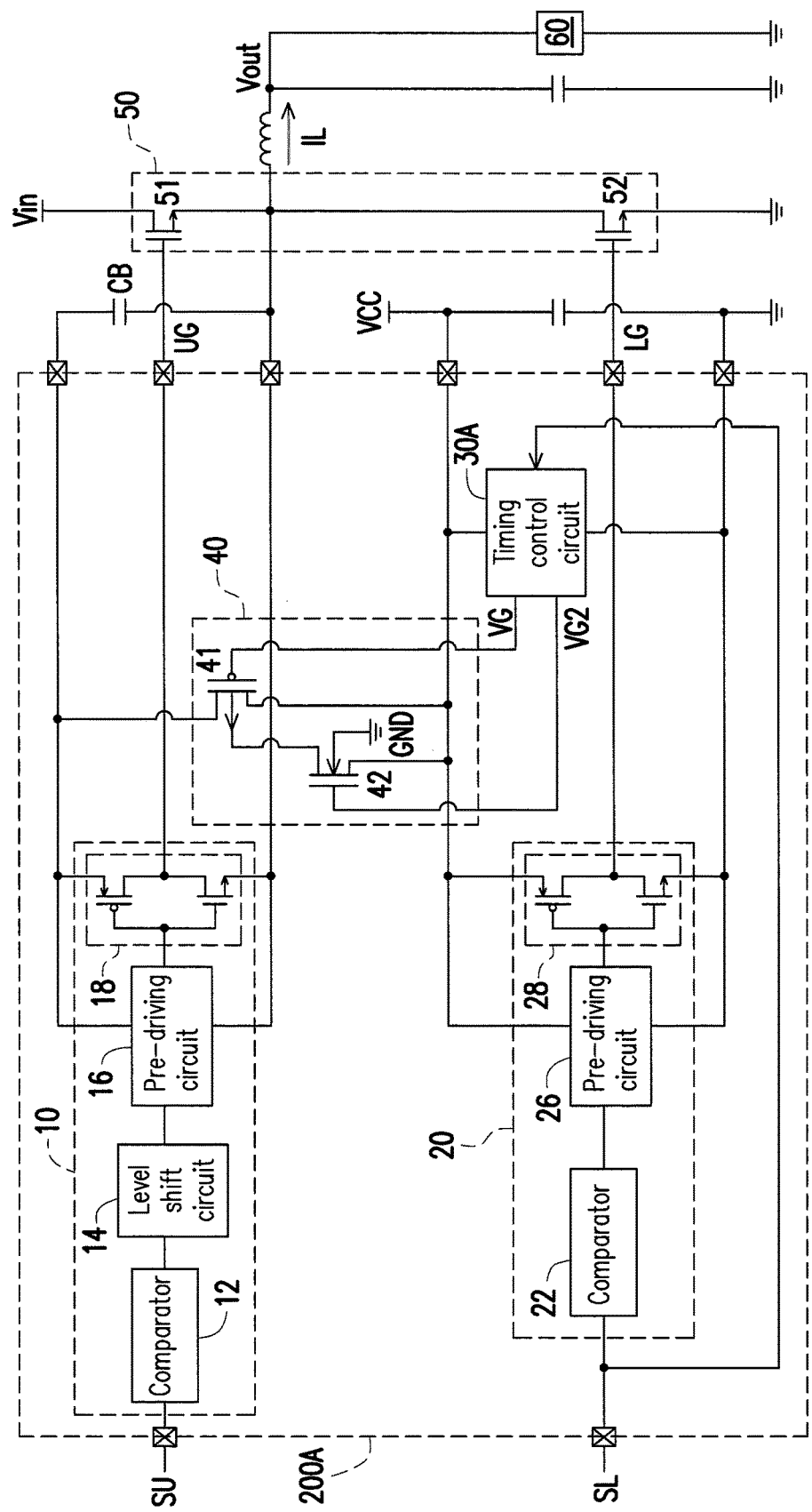
FIG. 2 is a circuit diagram of a gate driver according to an embodiment of the invention.
Figure 4:
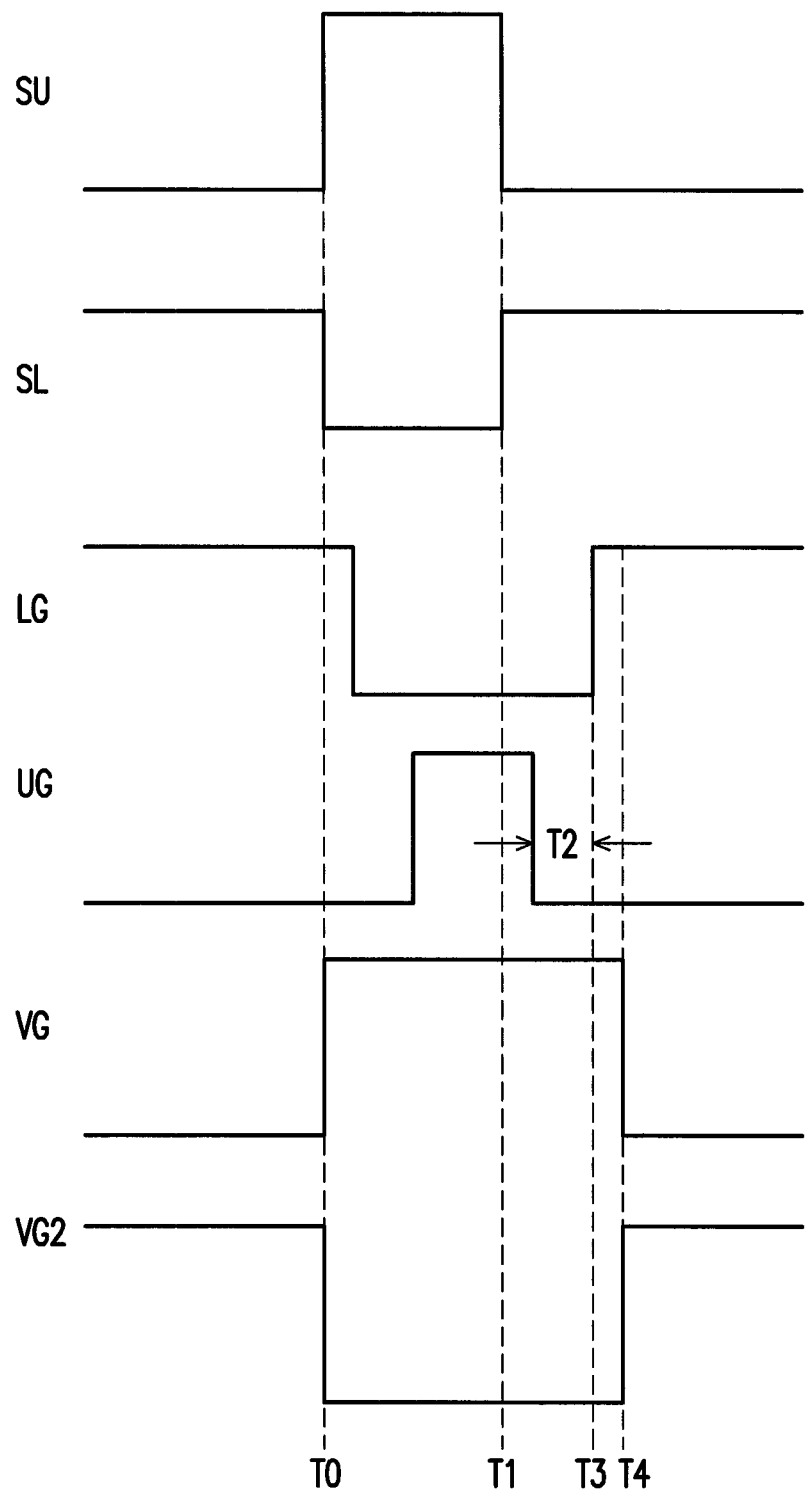
FIG. 4 is a waveform diagram of a gate driver according to an embodiment of the invention.

FIG. 2 is a circuit diagram of a gate driver according to an embodiment of the invention. FIG. 4 is a waveform diagram of the gate driver according to an embodiment of the invention. Referring to FIG. 2 and FIG. 4, in the present embodiment, the gate driver can be applied in a direct current (DC)-DC converter, and in other embodiments, the gate driver can also be applied to other circuits used for driving a transistor switch element, which is not limited by the invention. The DC-DC converter may include a pulse width modulation (PWM) control circuit, a gate driver 200A and an output stage 50. The gate driver 200A can be implemented on an integrated circuit alone. In other embodiments, the gate driver 200A and the output stage 50 can be integrated in a same integrated circuit package. Moreover, the gate driver 200A and the PWM control circuit can also be integrated in a same integrated circuit. In the present embodiment, as a gallium nitride (GaN) transistor probably has a negative voltage problem to result in a fact that a voltage value across a capacitor CB exceeds a withstand voltage range of the GaN transistor (especially a first switch 51), the invention provides a resolution to resolve the above problem.

The output stage 50 includes the first switch 51 and a second switch 52. The first switch 51 is coupled to the second switch 52. The gate driver 200A generates driving signals UG and LG according to driving input signals SU and SL, where the driving signal UG is used for controlling an operation of the first switch 51, and the driving input signal SU is associated with the first switch 51; and the driving signal LG is used for controlling an operation of the second switch 52, and the driving input signal SL is associated with the second switch 52. In an embodiment, the first switch 51 and the second switch 52 are gallium nitride (GaN) transistors. In other embodiments, the first switch 51 and the second switch 52 can also be high electron mobility transistors (HEMT), AlGaN transistors or other III-V group transistors. The output stage 50 is used for performing a direct current (DC)-DC conversion to the input voltage Vin, and the DC-DC converter can output an output voltage Vout to a load 60.

The gate driver 200A may include a driver circuit 10, a driver circuit 20, a timing control circuit 30A and a switch circuit 40. The timing control circuit 30A is coupled to the driver circuit 20. The switch unit 40 is coupled to the driver circuit 10, the driver circuit 20, the timing control circuit 30, the capacitor CB and a working voltage VCC.

The timing control circuit 30A receives the driving input signal SL associated with the second switch 52 and performs timing control to the driving input signal SL to generate a first control signal VG and a second control signal VG2. The switch unit 40 enables the working voltage VCC to charge the capacitor CB through the switch unit 40 according to the first control signal VG and the second control signal VG2. Moreover, the driving input signal SL is an inverted signal of the driving input signal SU. In other embodiments, the timing control circuit 30A can also receive the driving input signal SU to perform the timing control.

The driver circuit 10 includes a comparator 12, a level shift circuit 14, a pre-driving circuit 16 and an inverter 18. The comparator 12 receives the driving input signal SU and determines a logic level of the driving input signal SU. The level shift circuit 140 is coupled to an output of the comparator 12. The pre-driving circuit 16 is coupled to an output of the level shift circuit 14. The inverter 18 is coupled to the pre-driving circuit 16, the capacitor CB and the switch unit 40. The inverter 18 generates the driving signal UG to control the first switch 51 in response to the output of the comparator through the level shift circuit 14 and the pre-driving circuit 16.

The driver circuit 20 includes a comparator 22, a pre-driving circuit 26 and an inverter 28. Operations of various components in the driver circuit 20 are similar to the operations of the components in the driver circuit 10, and details thereof are not repeated.

The driving input signal SL is an inverted signal of the driving input signal SU, and the timing control circuit 30A can determine a level variation according to one of the driving input signal SU and the driving input signal SL, so as to generate the first control signal VG and the second control signal VG2 having a first level (for example, a logic low level) or a second level (for example, a logic high level), where the second control signal VG2 is an inverted signal of the first control signal VG.

In an embodiment, the switch unit 40 includes a first switch element 41 and a second switch element 42. The first switch element 41 and the second switch element 42 can be metal oxide semiconductor (MOS) transistors. The second switch element 42 is coupled to a bulk (or body) terminal of the first switch element 41 and a first terminal of the first switch element 41. The first terminal of the first switch element 41 receives the working voltage VCC. A second terminal of the first switch element 41 is coupled to the capacitor CB. In the present embodiment, the first switch element 41 can be a P-type MOS transistor (PMOS), and the second switch element 42 can be an N-type MOS transistor (NMOS). A control terminal of the first switch element 41 receives the first control signal VG. A control terminal of the second switch element 42 receives the second control signal VG2. A bulk terminal of the second switch element 42 is coupled to ground GND. According to the aforementioned coupling relationship of the first switch element 41 and the second switch element 42, the second switch element 42 can control a body voltage of the first switch element 41 according to the second control signal VG2.

Referring to FIG. 2 and FIG. 4, at a time point T0, when the driving input signal SL is changed from the second level (i.e. the logic high level) to the first level (i.e. the logic low level), the timing control circuit 30A immediately provides the first control signal VG having the logic high level and the second control signal VG2 having the logic low level or provides the same within several nanoseconds to turn off the first switch element 41 and the second switch element 42, such that the first switch element 41 cuts off a charging path between the working voltage VCC and the capacitor CB, and due to that the second switch element 42 is turned off, the first switch element 41 presents a floating state and is turned off completely so that the working voltage VCC cannot charge the capacitor CB through the switch unit 40.

At a time point T1, when the driving input signal SL is changed from the first level (i.e. the logic low level) to the second level (i.e. the logic high level), before the driving signal UG is changed to the logic low level and the driving signal LG is changed to the logic high level (a time period between the time point T1 and the time point T3), the first switch 51 and the second switch 52 are all turned off during a time period T2. The time period T2 is a non-interactive time. Since the inductor current IL flows through the parasitic diode of the second switch 52, the capacitor CB cannot be charged, so as to avoid a situation that the voltage value across the capacitor CB exceeds a withstand voltage range of the first switch 51. Therefore, in the present embodiment, after the driving input signal SL is changed from the first level to the second level by a predetermined time, the timing control circuit 30A provides the first control signal VG and the second control signal VG2 to turn on the first switch element 41 and the second switch element 42 at a time point T4, so as to effectively avoid damage of the first switch 51 due to excessive voltage across the capacitor CB. When the timing control of the timing control circuit 30A is designed, the aforementioned predetermined time can be designed according to a time required for changing the driving signal LG from the logic low level to the logic high level (a period from the time point T1 to the time point T3), where the time point T4 can be the time point T3 or after the time point T3. In other embodiments, the timing control circuit 30A can also provide the aforementioned first control signal VG and the second control signal VG2 after the driving input signal SU is changed from the second level to the first level by the predetermined time.

When the first switch element 41 and the second switch element 42 are turned on, the body terminal and the first terminal of the first switch element 41 are shorted, and the body terminal of the first switch element 41 receives the working voltage VCC, such that the working voltage VCC can charge the capacitor CB through the switch unit 40, so as to form a charging path.

Figure 3:
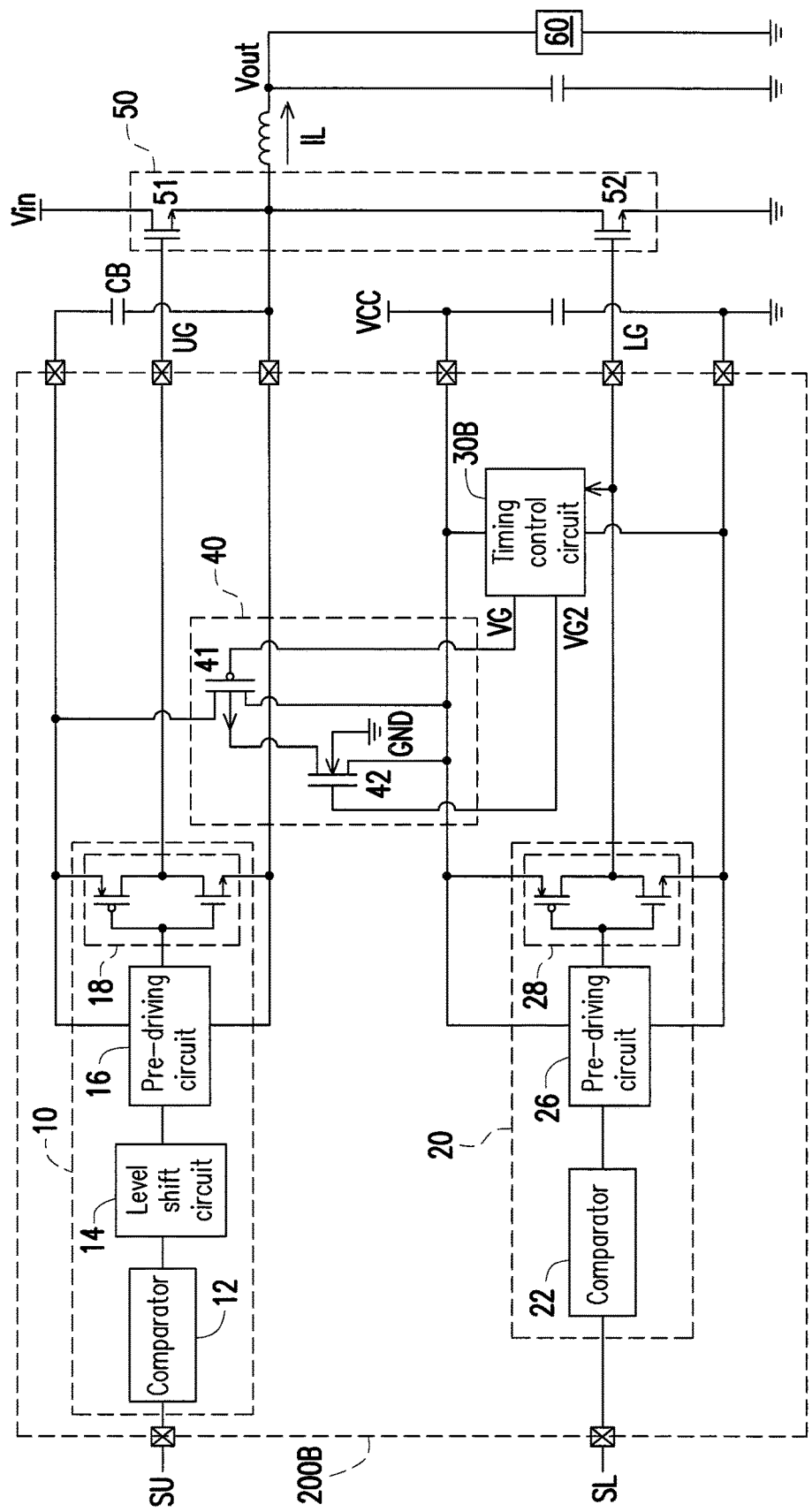
FIG. 3 is a circuit diagram of a gate driver according to another embodiment of the invention.

FIG. 3 is a circuit diagram of a gate driver according to another embodiment of the invention. The embodiment of FIG. 3 is a variation of the embodiment of FIG. 2. A structure and functions of the gate driver 200B of FIG. 3 are similar to that of the gate driver 200A of FIG. 2, and a difference there between lies in the driver circuit 20 and the timing control circuit 30B in the gate driver 200B, and the input control signal is the driving signal LG. Since the driving signal LG is generated after the input signal SL is processed by the pre-driving circuit 26, the driving signal LG falls behind the driving input signal SL in timing.

Referring to FIG. 3 and FIG. 4, when the driving input signal SL is changed from the second level (i.e. the logic high level) to the first level (i.e. the logic low level), the driving signal LG generated by the driver circuit 20 of FIG. 3 slightly falls behind the driving input signal SL. When the driving input signal SL is changed from the first level (i.e. the logic low level) to the second level (i.e. the logic high level), the driving signal LG generated by the driver circuit 20 of FIG. 3 falls behind the driving input signal SL by a time slightly longer than the predetermined time. Therefore, according to the design of the timing control circuit 30B, timing control can also be performed to the driving signal LG to generate the first control signal VG and the second control signal VG2.

Figure 5:
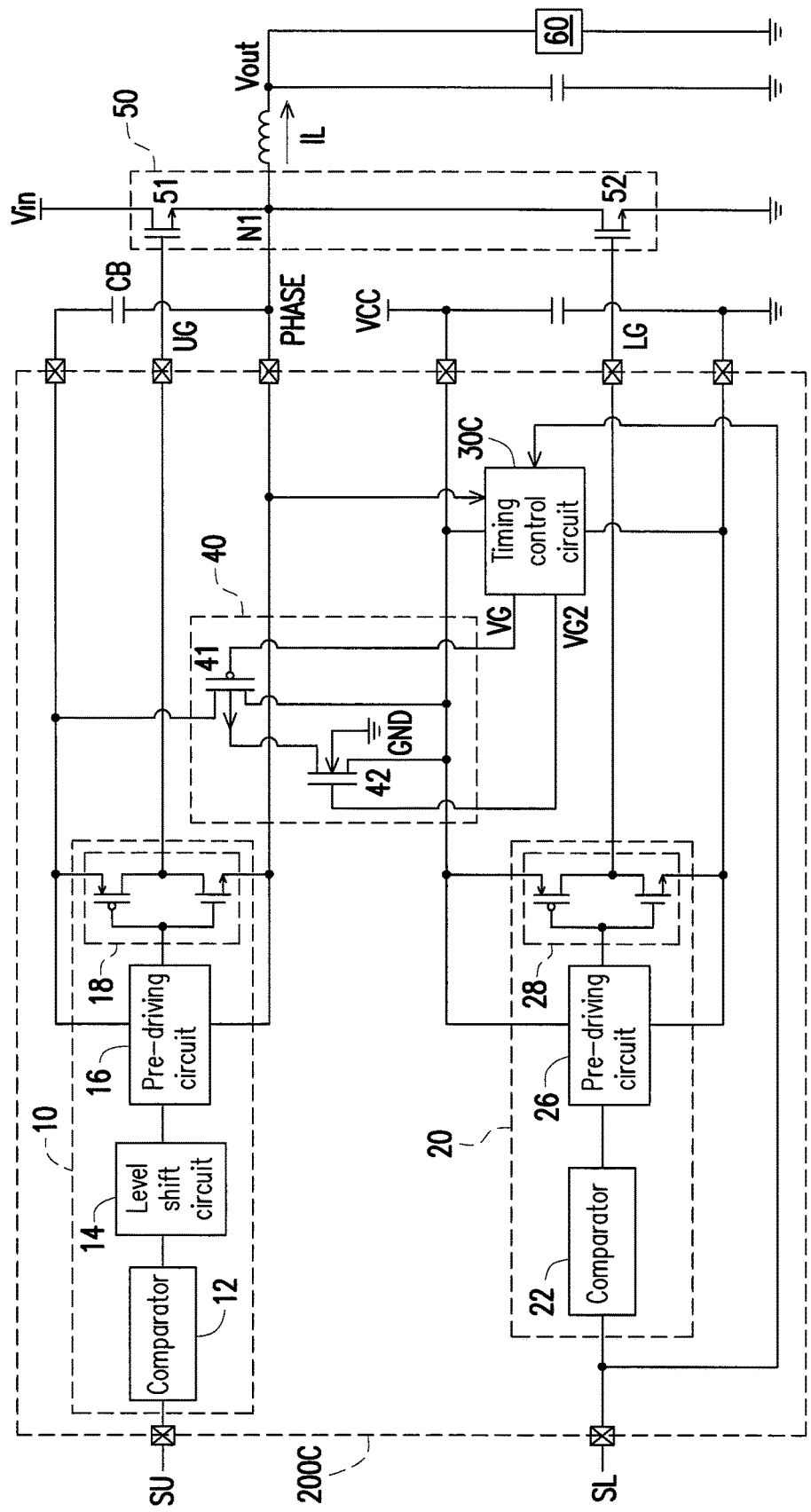
FIG. 5 is a circuit diagram of a gate driver according to another embodiment of the invention.
Figure 6:
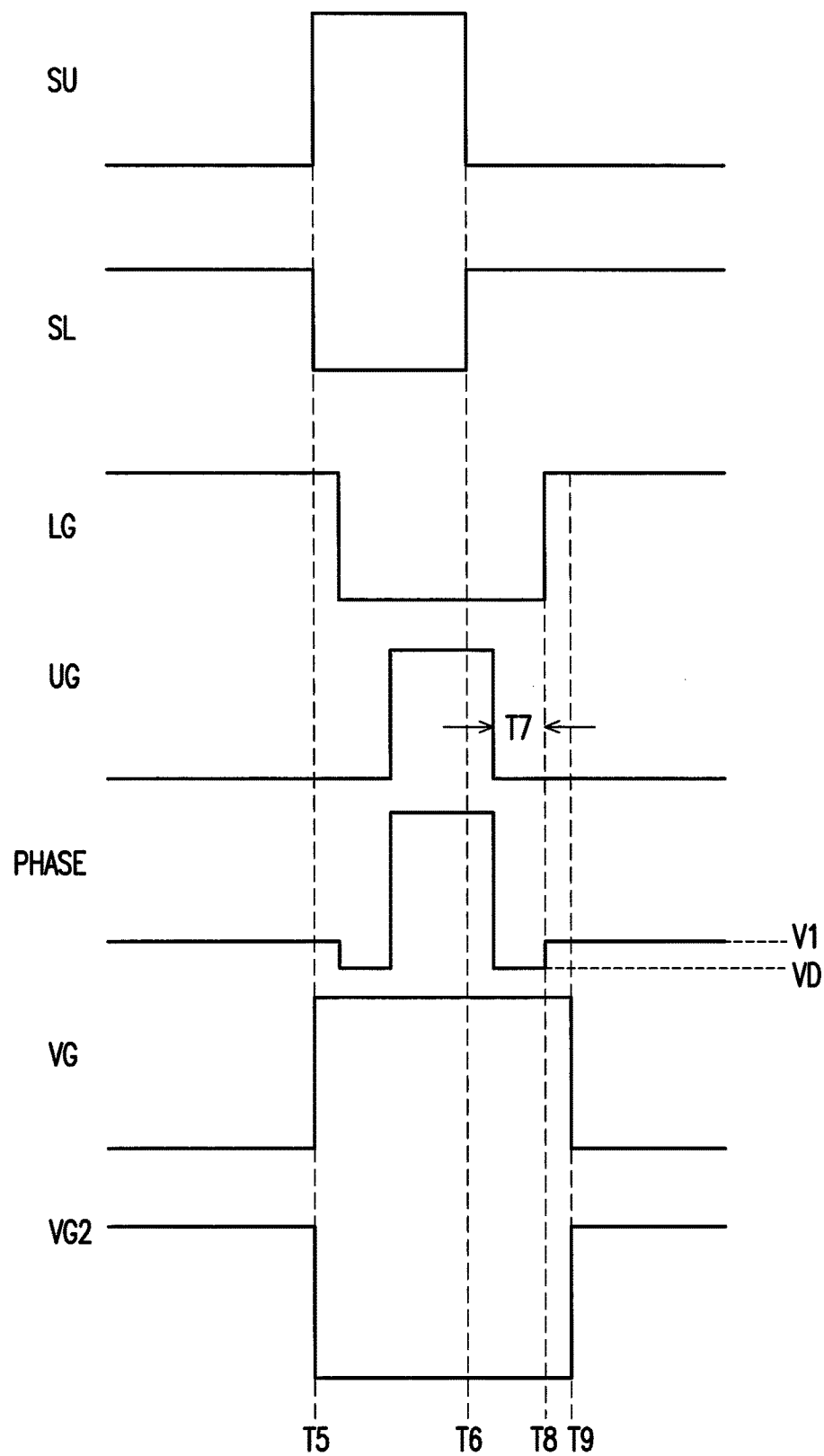
FIG. 6 is a waveform diagram of a gate driver according to another embodiment of the invention.

FIG. 5 is a circuit diagram of a gate driver according to another embodiment of the invention. FIG. 6 is a waveform diagram of the gate driver according to another embodiment of the invention. Referring to FIG. 5 and FIG. 6, the DC-DC converter can include a gate driver 200C and the output stage 50.

The gate driver 200C generates the driving signals UG and LG according to the driving input signals SU and SL, so as to respectively control the first switch 51 and the second switch 52. The first switch 51 and the second switch 52 have a phase node N1 there between.

The gate driver 200C includes a driver circuit 10, a driver circuit 20, a timing control circuit 30C and a switch unit 40. The timing control circuit 30C is coupled to the driver circuit 10, the driver circuit 20 and the phase node N1. The phase node N1 is located between the first switch 51 and the second switch 52. The input control signal can be the driving input signal SU, the driving input signal SL, the driving signal UG, the driving signal LG or a voltage PHASE on the phase node N1. The timing control circuit 30C can generate the first control signal VG and the second control signal VG2 according to a level variation of the input control signal.

In an exemplary embodiment, the input control signal is the voltage PHASE on the phase node N1. The timing control circuit 30C detects a level variation of the voltage PHASE to generate various control signals. The timing control circuit 30C includes a comparator (not shown). When the level of the voltage PHASE raises from a negative voltage to the predetermined voltage (for example, raises from −2V to −0.5V), the comparator generates a phase control signal, and the timing control circuit 30C generates the first control signal VG and the second control signal VG2 after the predetermined time.

Details of the driver circuit 10, the driver circuit 20 and the switch unit 40, and coupling relations and operation methods thereof may refer to related descriptions of FIG. 2 and FIG. 3, which are not repeated.

The gate driver 200C controls switching of the first switch 51 and the second switch 52. The second switch element 42 controls the body voltage of the first switch element 41 according to the second control signal VG2. At a time point T5, when the driving input signal SL is changed from the second level (i.e. the logic high level) to the first level (i.e. the logic low level), the timing control circuit 30C immediately provides the first control signal VG having the logic high level and the second control signal VG2 having the logic low level or provides the same within several nanoseconds to turn off the first switch element 41 to cut off a connection between the body terminal and the first terminal of the first switch element 41 and the second switch element. In this way, the first switch element 41 presents a floating state and is turned off completely, such that the working voltage VCC cannot charge the capacitor CB through the switch unit 40.

At a time point T6, when the driving input signal SL is changed from the first level (i.e. the logic low level) to the second level (i.e. the logic high level), before the driving signal UG is changed to the logic low level and the driving signal LG is changed to the logic high level (a time period between the time point T6 and a time point T8), the first switch 51 and the second switch 52 are all turned off during a time period T7. The time period T7 is a non-interactive time. Since the inductor current IL flows through the parasitic diode of the second switch 52, the capacitor CB cannot be charged, so as to avoid a situation that the voltage value across the capacitor CB exceeds the withstand voltage range of the first switch 51. Therefore, after the predetermined time, the timing control circuit 30C determines whether a level of the voltage PHASE is a predetermined voltage V1 at a time point T9. If the determination result is affirmative, it represents that the first switch 51 is turned on. Therefore, the timing control circuit 30C provides the first control signal VG and the second control signal VG2 to turn on the first switch element 41 and the second switch element 42.

Moreover, when the first switch element 41 and the second switch element 42 are turned on, the body terminal and the first terminal of the first switch element 41 are shorted, and the body terminal of the first switch element 41 receives the working voltage VCC, such that the working voltage VCC can charge the capacitor CB through the switch unit 40, so as to form a charging path.

A principle of determining the level of the voltage PHASE is as follows. When the inductor current IL is a positive current, it flows through the second switch 52 to form a negative voltage (the predetermined voltage V1) on the phase node N1 (i.e. $-IL \times Ron52$, a negative inductor current IL multiplies a turn-on resistance of the second witch 52); if the second switch 52 is not turned on, in case of the continuous inductor current, the current flows through the parasitic diode of the second switch 52 to form another negative voltage VD on the phase node N1. The negative voltage VD generally exceeds −1 volt relative to the GaN transistor. The negative voltage VD and the $-IL \times Ron52$ have an obvious difference. In other words, the timing control circuit 30C turns on the first switch element 41 according to whether the level of the voltage PHASE is the predetermined voltage V1 (i.e. $-IL \times Ron52$).

In an embodiment, if the level of the voltage PHASE is the negative voltage VD after the predetermined time, the aforementioned determination result is negative, and the level of the voltage PHASE is again determined after another predetermined time until the level of the voltage PHASE is equal to the predetermined voltage V1.

Figure 7:
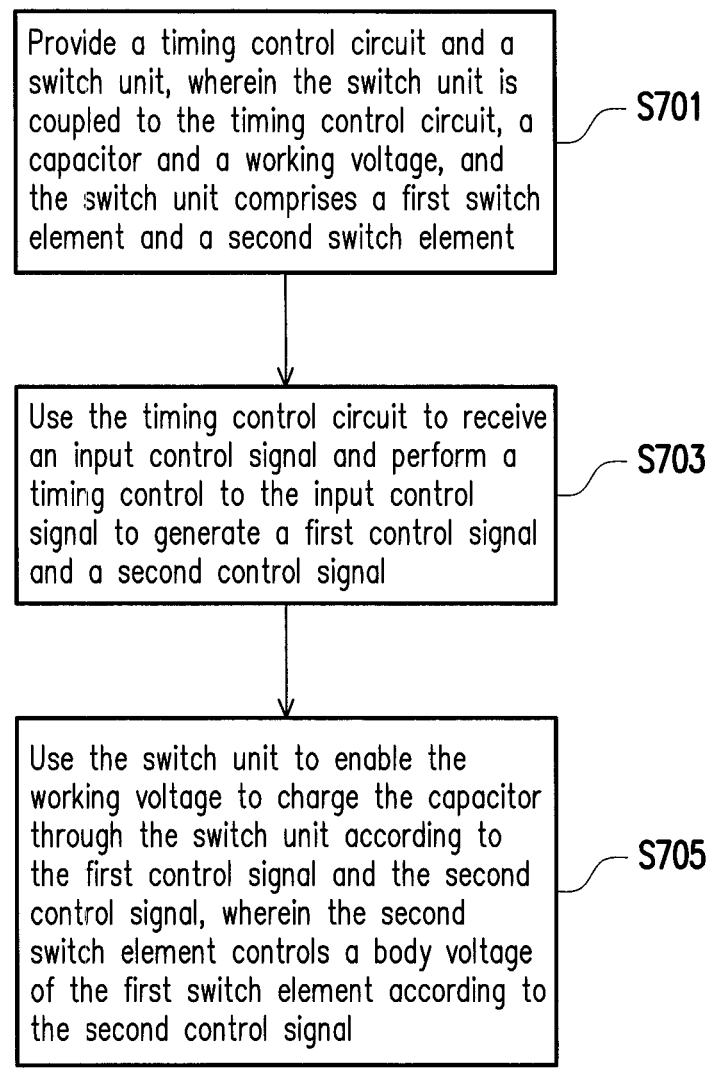
FIG. 7 is a flowchart illustrating a control method of a gate driver according to an embodiment of the invention.

According to the aforementioned descriptions, a general control method of the gate driver is deduced as follows. FIG. 7 is a flowchart illustrating a control method of a gate driver according to an embodiment of the invention. For simplicity's sake, referring to FIG. 2 and FIG. 7, the control method of the gate driver of the present embodiment includes following steps.

In step S701, the timing control circuit 30A and the switch unit 40 are provided, where the switch unit 40 is coupled to the timing control circuit 30A, the capacitor CB and the working voltage VCC. The switch unit 40 includes the first switch element 41 and the second switch element 42. In step S703, the timing control circuit 30A is used to receive an input control signal (for example, the driving input signal SL), and perform a timing control (for example, a delay control) to the input control signal to generate the first control signal VG and the second control signal VG2.

Then, in step S705, the switch unit 40 is used to enable the working voltage VCC to charge the capacitor CB through the switch unit 40 according to the first control signal VG and the second control signal VG2, where the second switch element 42 controls a body voltage of the first switch element 41 according to the second control signal VG2.

In summary, the gate driver of the invention includes the timing control circuit and the switch unit. The timing control circuit performs timing control to the input control signal to generate the first control signal and the second control signal. The switch unit enables the working voltage to charge the capacitor through the switch unit according to the first control signal and the second control signal, where the switch unit includes a first switch element and a second switch element, and the second switch element controls the body voltage of the first switch element according to the second control signal. In this way, by controlling a charging path of the capacitor, damage of a switch in the output stage due to excessive voltage across the capacitor is avoided. On the other hand, compared to the conventional technique, the gate driver and the control method thereof provide a simple circuit design, and the gate driver can be configured to an integrated circuit to decrease a layout area and cost thereof.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:
1. A gate driver, coupled to a capacitor, the gate driver comprising:
   a timing control circuit, receiving an input control signal and performing a timing control to the input control signal to provide a first control signal and a second control signal different from the first control signal; and
   a switch unit, coupled to the timing control circuit, the capacitor and a working voltage, and enabling the working voltage to charge the capacitor through the switch unit according to the first control signal and the second control signal,
   wherein the switch unit comprises a first switch element and a second switch element, wherein a control terminal of the first switch element is coupled to the first control signal, and the second switch element is coupled between a body terminal of the first switch element and a first terminal of the first switch element, and a control terminal of the second switch element is coupled to the second control signal and controls a body voltage of the first switch element according to the second control signal.

2. The gate driver as claimed in claim 1, wherein the input control signal is a driving input signal, and when the driving input signal is changed from a first level to a second level, the timing control circuit generates the first control signal and the second control signal after a predetermined time.

3. The gate driver as claimed in claim 1, wherein the input control signal is a driving signal, and when the driving signal is changed from a first level to a second level, the timing control circuit generates the first control signal and the second control signal after a predetermined time.

4. The gate driver as claimed in claim 1, wherein the gate driver is coupled to a phase node, the input control signal is a phase control signal, and when a voltage on the phase node is changed from a negative voltage to a predetermined voltage, the phase control signal is generated to enable the timing control circuit to generate the first control signal and the second control signal after a predetermined time.

5. The gate driver as claimed in claim 1, wherein when the input control signal is changed from a second level to a first level, the timing control circuit controls to turn off the switch unit so that the working voltage is unable to charge the capacitor through the switch unit.

6. The gate driver as claimed in claim 1, wherein the gate driver is further coupled to a first switch and a second switch, the first switch is coupled to the second switch, the first switch and the second switch have a phase node there between, and the gate driver is coupled to the phase node.

7. The gate driver as claimed in claim 6, wherein the input control signal is associated with the second switch.

8. The gate driver as claimed in claim 6, wherein the first switch and the second switch is a gallium nitride transistor.

9. A control method of a gate driver, comprising:
providing a timing control circuit and a switch unit, wherein the switch unit is coupled to the timing control circuit, a capacitor and a working voltage, and the switch unit comprises a first switch element and a second switch element;
using the timing control circuit to receive an input control signal and performing a timing control to the input control signal to provide a first control signal and a second control signal different from the first control signal; and
using the switch unit to enable the working voltage to charge the capacitor through the switch unit according to the first control signal and the second control signal, wherein the first switch element is controlled by the first control signal and the second switch element is controlled by the second control signal, wherein the second switch element is coupled between a body terminal of the first switch element and a first terminal of the first switch element to control a body voltage of the first switch element according to the second control signal.

10. The control method of the gate driver as claimed in claim 9, wherein the input control signal is a driving input signal, and when the driving input signal is changed from a first level to a second level, the timing control circuit generates the first control signal and the second control signal after a predetermined time.

11. The control method of the gate driver as claimed in claim 9, wherein the input control signal is a driving signal, and when the driving signal is changed from a first level to a second level, the timing control circuit generates the first control signal and the second control signal after a predetermined time.

12. The control method of the gate driver as claimed in claim 9, wherein the gate driver is coupled to a phase node, the input control signal is a phase control signal, and when a voltage on the phase node is changed from a negative voltage to a predetermined voltage, the phase control signal is generated to enable the timing control circuit to generate the first control signal and the second control signal after a predetermined time.

13. The control method of the gate driver as claimed in claim 9, wherein when the input control signal is changed from a second level to a first level, the timing control circuit controls to turn off the switch unit so that the working voltage is unable to charge the capacitor through the switch unit.

14. The control method of the gate driver as claimed in claim 9, wherein the gate driver is further coupled to a first switch and a second switch, the first switch is coupled to the second switch, the first switch and the second switch have a phase node there between, and the gate driver is coupled to the phase node.

15. The control method of the gate driver as claimed in claim 14, wherein the input control signal is associated with the second switch.

16. The control method of the gate driver as claimed in claim 14, wherein the first switch and the second switch is a gallium nitride transistor.

17. A gate driver, coupled to a capacitor, a working voltage, a first switch and a second switch, wherein one terminal of the capacitor is coupled to a common node between the first switch and the second switch, the gate driver comprising:
a timing control circuit, receiving an input control signal and performing a timing control function to the input control signal to generate a first control signal and a second control signal; and
a switch unit, comprising a first switch element and a second switch element, wherein the first switch element is coupled to the capacitor, the working voltage, and the timing control circuit, and the second switch element is coupled to the first switch element, the working voltage, and the timing control circuit,
wherein the input control signal is coupled to the second switch to control the second switch, when the input control signal controls the second switch to turn on, and after the second switch is turned on for a predetermined time, the timing control circuit generates the first control signal and the second control signal to turn on the first switch element and the second switch element, so as to form a charge path through the working voltage, the first switch element and the capacitor.

\* \* \* \* \*